United States Patent [19]

Goel et al.

[11] 4,117,301
[45] Sep. 26, 1978

[54] METHOD OF MAKING A SUBMICROMETER APERTURE IN A SUBSTRATE

[75] Inventors: Jitendra Goel, Kendall Park; Subrahmanyam Yegna Narayan, Belle Mead, both of N.J.; Ira Drukier, New York, N.Y.

[73] Assignee: RCA Corporation, New York, N.Y.

[21] Appl. No.: 822,540

[22] Filed: Aug. 8, 1977

Related U.S. Application Data

[63] Continuation of Ser. No. 597,763, Jul. 21, 1975, abandoned.

[51] Int. Cl.² ............................................. B23K 9/00
[52] U.S. Cl. .................... 219/121 EM; 219/121 LM
[58] Field of Search ..... 219/121 L, 121 LM, 121 EB, 219/121 EM; 250/492 R, 492 A, 514; 29/578, 579, 580, 583, 625; 96/36, 2; 15/12

[56] References Cited

U.S. PATENT DOCUMENTS

| | | | |
|---|---|---|---|
| 3,491,236 | 1/1970 | Newberry | 219/121 EM X |
| 3,679,497 | 7/1972 | Hanty et al. | 219/121 EM X |
| 3,851,382 | 12/1974 | Stork | 219/121 EM X |
| 3,860,783 | 1/1975 | Schmidt et al. | 219/121 EM |

FOREIGN PATENT DOCUMENTS 451,332  5/1968  Switzerland ............... 219/121 EM

OTHER PUBLICATIONS

Intro. to Electron Beam Tech., Bakish, 1962 p. 365

*Primary Examiner*—J. V. Truhe
*Assistant Examiner*—Fred E. Bell
*Attorney, Agent, or Firm*—H. Christoffersen; T. H. Magee

[57] ABSTRACT

A mask for manufacturing microcircuits is comprised of a substratum and a layer of matter, such as, for example gold, adjacent the substratum. An aperture is located in the layer of matter. The aperture in the layer of matter exhibits a cross-section resembling an inverted isosceles trapezoid. The method for manufacture of the mask comprises the steps of appositioning a patterned layer of photoresist to a layer of gold which is adjacent the substratum. The structure comprising the photoresist, the gold layer and the substratum is exposed to a beam of ions having a preselected kinetic energy such that the ions remove gold exposed by apertures in the photoresist layer. The kinetic energy of the ions is selected such that an aperture is eroded in the layer of gold, the aperture exhibiting an inverted isosceles trapezoidal cross-section.

10 Claims, 11 Drawing Figures

METHOD OF MAKING A SUBMICROMETER APERTURE IN A SUBSTRATE

This is a continuation of application Ser. No. 597,763, filed July 21, 1975, now abandoned.

This invention relates to methods for obtaining micron and sub-micron apertures and masks for the production of such devices as field effect transistors, surface acoustic wave devices, thin film optical devices and integrated circuits. This invention also relates to masks which are used for the production of micron and sub-micron width metallizations on microcircuit devices.

One known type of mask is comprised of a pattern in a thin film of chromium or iron oxide on a thin glass substrate. One method for producing the mask involves a photolithographic technique known as shadow printing, also commonly called contact printing. In this method, a layer of photoresist is formed adjacent a thin film of matter, such as, for example, chromium or iron oxide, the thin film of matter being supported by the thin glass substrate. A film consisting of a negative of a pattern to be formed in the layer of matter is placed adjacent the photoresist. A positive pattern is formed in the photoresist by exposure of the photoresist through the film with ultraviolet light, X-rays, or visible light, for example.

Irradiation of the layer of photoresist polymerizes the portions of the layer of photoresist not shielded by the film. Accordingly, those unexposed portions of the photoresist may be removed by immersion of the blank mask with the layer of photoresist adjacent thereto into a solvent which dissolves unpolymerized photoresist. Such solvents are known and available to one of ordinary skill in this art.

In the shadow printing method a pattern is formed in the layer of matter (by chemical etching) according to the pattern in the layer of photoresist. In this technique a chemical etchant which will attack and etch the layer of matter and which will not attack the photoresist is used. After formation of the pattern in the layer of matter with the etchant, the photoresist is removed. The resulting structure is a positive pattern formed in the matter with respect to the negative pattern of the film. The smallness of the apertures in the layer of matter as formed by the shadow printing technique is limited by the degree to which the film conforms to the contours of the layer of photoresist. In addition, the shadow printing technique is limited by the resolution obtainable in the film used to define the negative pattern. The pattern in the layer of matter beneath the photoresist is formed by chemical etching, and the etchant attacks the matter in all directions. Thus, the etchant undercuts the photoresist and thereby dilates the apertures defined for the layer of matter according to the pattern defined in the photoresist.

To provide greater resolution in the replication of the apertures in the film into the layer of photoresist X-ray photolithography or electron projection are sometimes used. X-ray photolithography is a shadow printing technique similar in principle to photolithograhic shadow printing. In electron projection, electron scattering within the layer of photoresist and from the substrate places limitations on the resolution attainable with this method.

In the manufacture of microwave field effect transistors it is especially important that the gates of these devices sometimes have a sub-micron electron path length. The electron path length is defined as the dimension of the gate measured from a source to a corresponding drain in a direction such that the measuring path is perpendicular to a principle dimension of the gate, the measuring path extending from a source to a corresponding drain of the device, the principle dimension of the gate extending along a channel, the channel being located in between the source and the drain.

In one known method of manufacturing a field effect transistor with a metal gate, a channel is etched in a semiconductor substrate. A rectangular aperture is defined in a photoresist layer adjacent the substrate and a removing means such as, for example, a chemical etchant is used to remove a portion of the substrate to form a channel in the semiconductor substrate. Typically, the channel has the geometrical dimensions of a rectangular solid. Because of the pecularity of etchants commonly known and used in this art whereby these etchants attack the sides and the bottom of the channel being formed at substantially the same rate, the cross-section of the solid rectangular channel resembles an inverted isosceles trapezoid. One advantage of the isosceles trapezoid cross-section of the channel is that an evaporation of a metal gate into the channel using the upper edges of the channel aperture as a shield can produce a metal gate with a width equal to the width of the channel opening at the surface of the semiconductor substrate. A need exists, therefore, for a mask capable of producing micron and sub-micron apertures in the initial layer of photoresist which may be used to define an aperture for the channel opening at the surface of the substance.

Briefly, the novel method of the present invention is the manufacture of a mask comprised of a substrate with a thin layer of matter and a thick layer of matter thereon. The thick layer has a pattern formed therein by means of ion beam milling. The pattern is located in a thick layer of a soft noble metal and is formed by use of a preselected energy for the ion beam such that a graded reduction in the opening of the aperture toward the bottom of the thick layer is obtained. An aperture is subsequently formed in the thin layer either by ion beam milling or chemical etching. The essence of the method of the present novel invention is the preselection of an energy of an ion beam and the use of the ion beam with the preselected energy to form an aperture in a thick layer of metal, the aperture having a cross-section resembling an inverted isosceles trapezoid.

Figure 1:
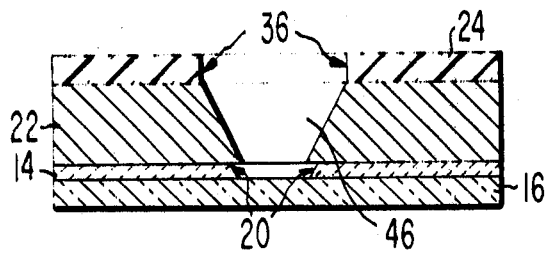
FIG. 1 is a cross-section of a structure comprising a mask with a through-hole therein, and metal and photoresist layers thereon.
Figure 9:
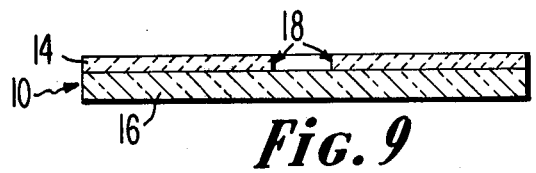
FIG. 9 is a cross-section of a mask having a blind aperture therein formed by milling.
Figure 10:
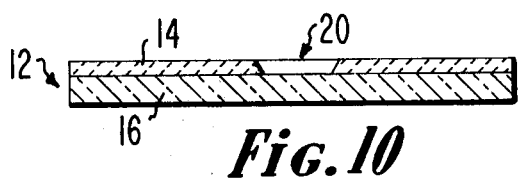
FIG. 10 is a cross-section of a mask having a blind aperture therein formed by etching.

Two exemplary masks for the production of a pattern in a layer of photoresist, which masks are useful for defining a channel for a field effect transistor, are shown at 10 and 12 in FIGS. 9 and 10 of the drawings. FIG. 1 is a top view of these masks. The masks may be produced by the present novel method.

Figure 11:
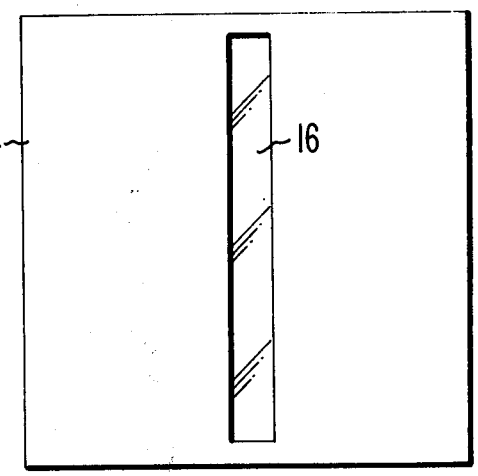
FIG. 11 is a top view of the masks of FIGS. 9 and 10.

Each of the masks 10 and 12 of FIGS. 9 and 10, respectively, is comprised of a glass substrate 16 with a layer 14 of matter thereon, such as, for example, chromium, chromium oxide, or iron oxide. (See also FIG. 11.) Specifically the mask 10 in FIG. 9 has a layer 14 of matter adjacent a glass substrate 16 with an aperture 18 in the layer 14. The aperture 18 has a rectangular cross-section, the cross-section being taken in a plane orthogonal to a principal surface of the substrate 16 and a principal dimension of the aperture 18. In FIG. 10 the mask 12 is shown comprised of a layer 14 of matter adjacent a substrate 16. The layer 14 in FIG. 10 has an aperture 20 therein, the aperture 20 being a rectangular opening and having an isosceles trapezoidal cross-section.

The substrate 16 for the masks shown in FIGS. 9 and 10 is typically a glass, such as, for example, Corning type 0211. The layer 14 of matter is typically either a thin film of chromium or chromium oxide 500Å to 1,000Å thick or a thin film of iron oxide, $Fe_2O_3$, 1,300Å thick. The apertures 18 and 20 are typically rectangular in plan view, having a width equal to or less than 1.0 micrometers.

Figure 2:
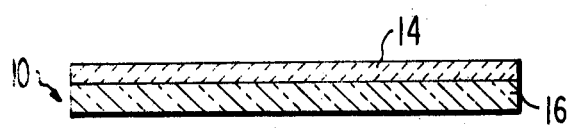
FIG. 2 is a cross-section of a mask blank.
Figure 3:
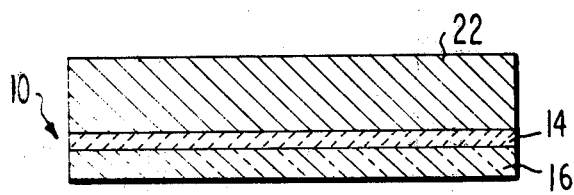
FIG. 3 is a cross-section of a structure comprising a mask blank with a layer of matter thereon.

The novel method of this invention may be practiced on a blank mask 10, such as that shown in FIG. 2. The blank mask 10 is comprised of a substrate 16. The substrate 16 has adjacent thereto a relatively thin layer 14 of matter, the layer being nonapertured. The blank mask 10 may be oriented in an evaporation chamber, for example, such that a relatively thick layer 22 of metal, such as, for example, gold on titanium is evaporated onto the layer 14 (see FIG. 3). The metal may be evaporated in the evaporation chamber by standard evaporation techniques onto a blank mask maintained at a temperature of 300° C. A typical thickness for the gold is approximately 1.5 micrometers; for titanium, a few Angstroms. The metallic layer 22 should be thick enough to permit a subsequent ion bombardment step to form an opening therein having the critical cross-section resembling an inverted isosceles trapezoid.

Figure 4:
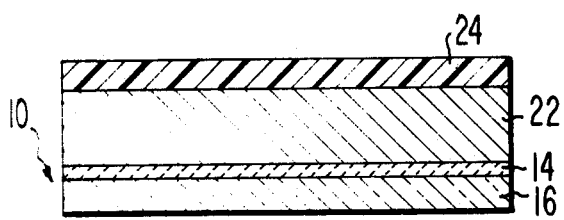
FIG. 4 is a cross-section of a mask blank with metal and photoresist layers thereon.
Figure 5:
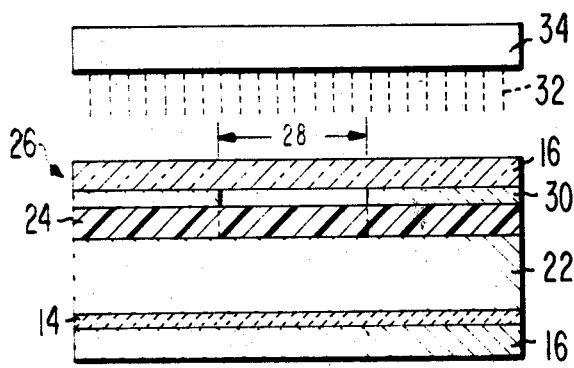
FIG. 5 is a cross-section of a structure comprising a mask blank with layers thereon and an exposure mask adjacent thereto.

FIG. 4 shows a layer 24 of photoresist appositioned to the layer 22. The layer 24 of photoresist may be deposited by a standard spin-on technique to a thickness of approximately 0.6 micrometers, the same as for the standard photolithography used in the shadow printing technique. In FIG. 5, a standard mask 26 having an aperture 28 in the layer 30 of matter is used to define a pattern in the layer 24 of photoresist. A typical procedure is to invert the mask 26 such that the layer 30 is adjacent the layer 24. Irradiation 32 from a source 34 is transmitted to the mask 26 and exposes that portion of the layer 24 of photoresist exposed by the aperture 28. Parameters such as exposure times, intensity of radiation, type of radiation are selected in accordance with the kind of photoresist used. These parameters are all well-known to persons of ordinary skill in this art and widely published. For example, a photoresist such as Kodak KTFR may be used for the layer 24. The mask 26 may be comprised of a substrate 16 of Corning glass type 021, 0.2 mm thick, and the layer 30 of matter thereon may be chromium, 500Å thick. For a layer 24 of KTFR 0.6 thick, an exposure time of 7.0 seconds is required using ultraviolet light from a 200 watt mercury vapor lamp mounted in a Kasper back exposure apparatus.

Figure 6:
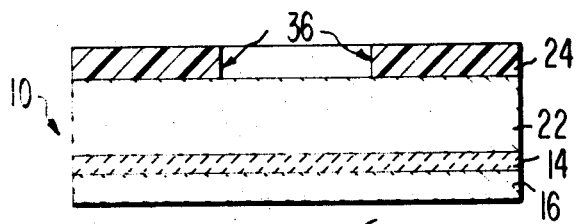
FIG. 6 is a cross-section of a structure comprising a mask blank with a patterned photoresist layer thereon.

After exposure to the irradiation 32 the layer 24 of photoresist is washed in a fluid, such as, for example, xylene to define an aperture 36 therein (see FIG. 6).

The structure of FIG. 6 is next subjected to bombardment by a beam of heavy ions, such as, for example, argon ions. This is sometimes referred to as ion beam milling. The ion beam may be produced by a Thompson CSF machine operating at an accelerating voltage of approximately 600V. The ions issue from the Thompson CSF machine, depicted graphically as an ion source 38, shown in FIG. 7. The inventors have discovered that, by adjustment of the energy of the ions in the ion beam to a particular value, an inverted isosceles trapezoidal aperture is produced in the layer 22. In this case, the layer 22 is 1.5 micrometers in thickness. The preselected energy for the ion beam is 0.6 keV. A duration for the ion beam milling may be selected such that only the layer 22 is milled, and not the layer 14. The duration of milling may be determined from the mill rate of the ion beam. In this example, a 0.6 keV argon beam etches at a rate of 0.005 micrometers per second.

The aperture 46 produced in the layer 22 is superior to any aperture produced by chemical etching. See FIG. 1. The aperture 46 has sidewalls which are substantially smoother than the sidewalls of apertures produced by chemical means. No spurs or protrusions are present on the sidewalls of the aperture 46.

Figure 7:
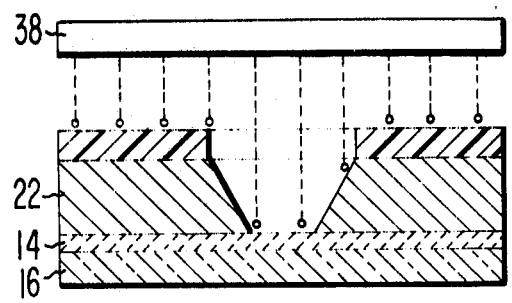
FIG. 7 is a cross-section of a structure comprising a mask blank undergoing ion beam milling of a layer of matter beneath the photoresist layer.
Figure 8:
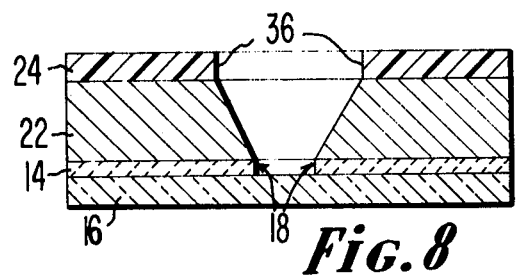
FIG. 8 is a cross-section of a structure comprising a mask having a milled aperture in two layers of matter appositioned to a substratum.

In one species of the method of the present novel invention ion beam milling is stopped when the surface of the layer 14 is reached (see FIG. 7). Another species of the method of the invention is illustrated in FIG. 8. In this species the ions (not shown) are permitted to remove a portion of the layer 14 to provide the aperture 18 therein. The aperture 18 in the layer 14 has a substantially rectangular cross-section in a plane orthogonal to the principal surface of the substrate 16 and the principal dimension of the aperture 18. The substantially rectangular cross-section is produced in the aperture 18 of the layer 14 when the layer 22 is comprised of a metal having the mechanical properties of gold and the layer 14 is comprised of a metal having mechanical properties similar to either chromium, chromium oxide, or ferric oxide.

In one species of the present novel invention only the layer 22 of, for example, gold is ion beam milled. Further processing of the species shown in FIG. 7 can produce the structure shown in FIG. 1 wherein an aperture 20 is chemically etched in the layer 14. When, for example, the layer 14 is chromium, the aperture 20 may be etched with a solution of hot HCl acid deposited into the aperture 46 of the layer 22.

In the manufacture of a mask such as shown in FIG. 9 or FIG. 10, it is illustrated in FIG. 1 that by the novel method of this invention the width of the rectangular aperture 20 (or 18, as shown in FIGS. 8 and 9) is smaller than that which is obtainable using ordinary photolithography and shadow printing. In FIG. 1, the aperture 20 is shown significantly smaller than the aperture 36 photolithographically produced in the layer 24 of photoresist. Similarly, in FIG. 8, the aperture 18 in the layer 14 adjacent the substrate 16 is significantly smaller than the aperture 36 photolithographically produced in the layer 24 of photoresist. Consequently, the present method can be used to manufacture masks for the production of channels in field effect transistors and consequential metallizations in the channels which are extremely narrow in width with respect to known prior art methods.

One of ordinary skill in this art may use masks produced by the method of the present novel invention in concatenation to achieve a mask having a reduced aperture with a width in the range of 500Å to 5,000Å or less. Thus, an original mask produced by this method may be used in this method to produce a new mask having aperture dimensions substantially smaller than the original mask.

We claim:

1. A method of making a submicrometer aperture in a substrate comprising the steps of:

placing at least one metallic layer adjacent a surface of said substrate, selectively protecting said metallic layer so that only a portion of said metallic layer is exposed, said portion being adjacent the desired location of said submicrometer aperture and having a predetermined width, bombarding said exposed portion of said metallic layer with a beam of ions having an energy of about 600 electron volts or less so that an opening having a cross-section resembling an isosceles trapezoid is formed therein, said opening exposing a section of said substrate whereat the width of said opening is narrowest, and removing said exposed section of said substrate utilizing said metallic layer with said opening therein as a mask, said predetermined width being selected of narrow enough value such that said removing step forms said submicrometer aperture.

2. A method as recited in claim 1 wherein said substrate comprises a mask blank including a relatively thin film of opaque material disposed on a glass plate, and wherein said placing step is performed by evaporating said metallic layer onto said opaque film.

3. A method as recited in claim 2 wherein said protecting step is performed by forming a layer of masking material on said metallic layer and then photolithographically removing portions of said masking layer so that said portion of said metallic layer is exposed.

4. A method as recited in claim 3 wherein said removing step is performed by continuing said bombarding with said ions so as to remove said exposed section of said opaque film.

5. A method as recited in claim 3 wherein said removing step is performed by etching said exposed section of said opaque film with a chemical etchant.

6. A method as recited in claim 3 wherein said metallic layer has a thickness of at least about one micrometer and comprises a layer of one or more metals selected from the group consisting of gold and titanium.

7. A method as recited in claim 3 wherein said masking material comprises photoresist.

8. A method as recited in claim 2 wherein said opaque material is selected from the group consisting of chromium, chromium oxide, and iron oxide.

9. A method as recited in claim 1 wherein said ions comprise heavy ions.

10. A method as recited in claim 9 wherein said heavy ions comprise argon ions.

* * * * *